United States Patent
Dev et al.

(10) Patent No.: US 12,387,308 B2
(45) Date of Patent: *Aug. 12, 2025

(54) DAMAGE DETECTION USING MACHINE LEARNING

(71) Applicant: Vehicle Service Group, LLC, Madison, IN (US)

(72) Inventors: Bodhayan Dev, Marlborough, MA (US); Atish P. Kamble, Arlington, MA (US); Prem Swaroop, Lexington, MA (US); Girish Juneja, Lexington, MA (US)

(73) Assignee: Vehicle Service Group, LLC, Downers Grove, IL (US)

( * ) Notice: Subject to any disclaimer, the term of this patent is extended or adjusted under 35 U.S.C. 154(b) by 247 days.

This patent is subject to a terminal disclaimer.

(21) Appl. No.: 18/150,665

(22) Filed: Jan. 5, 2023

(65) Prior Publication Data
US 2023/0230221 A1  Jul. 20, 2023

Related U.S. Application Data

(63) Continuation of application No. 17/105,184, filed on Nov. 25, 2020, now Pat. No. 11,574,395.

(51) Int. Cl.
  G06T 7/00 (2017.01)
  G06F 30/27 (2020.01)
  G06N 3/08 (2023.01)

(52) U.S. Cl.
  CPC ............ *G06T 7/0004* (2013.01); *G06F 30/27* (2020.01); *G06N 3/08* (2013.01);
  (Continued)

(58) Field of Classification Search
  CPC ......... G06T 7/0004; G06T 2207/10012; G06T 2207/20081; G06T 2207/20084;
  (Continued)

(56) References Cited

U.S. PATENT DOCUMENTS 4,188,544 A  2/1980 Chasson
7,616,300 B2  11/2009 Nohara et al.
(Continued)

FOREIGN PATENT DOCUMENTS

DE  202013000050  2/2013
DE  102014224274  6/2016
(Continued)

OTHER PUBLICATIONS

Alliedvision.com [Online], "Hail Damage: high-resolution cameras detect every dent," Sep. 13, 2016, [Retrieved on Mar. 24, 2021], retrieved from URL<https://www.alliedvision.com/en/news/detail/news/hail-damage-high-resolution-cameras-detect-every-dent.html>, 2 pages.
(Continued)

*Primary Examiner* — Ping Y Hsieh
(74) *Attorney, Agent, or Firm* — Fish & Richardson P.C.

(57) ABSTRACT

Systems and methods for detecting hail damage on a vehicle are described including, receiving an image of at least a section of a vehicle. Detecting a plurality of hail damage including, detecting a plurality of damaged areas distributed over the entire section of the vehicle, and differentiating the plurality of damaged areas from one or more areas of noise, processing the received image to classify one or more sections of the vehicle as one or more panels of the vehicle bodywork, and using the detected areas of damage, the classification of the seriousness of the damage and the classification of one or more panels to compute a panel damage density estimate.

20 Claims, 7 Drawing Sheets

(52) U.S. Cl.
CPC .............. G06T 2207/10012 (2013.01); G06T 2207/20081 (2013.01); G06T 2207/20084 (2013.01); G06T 2207/30252 (2013.01)

(58) Field of Classification Search
CPC ........... G06T 2207/30252; G06T 5/002; G06T 2207/30156; G06F 30/27; G06N 3/08
See application file for complete search history.

(56) References Cited

U.S. PATENT DOCUMENTS

| | | | |
|---|---|---|---|
| 8,243,289 | B2 | 8/2012 | Lin et al. |
| 10,521,952 | B2 | 12/2019 | Ackerson et al. |
| 10,921,118 | B2 | 2/2021 | Grauzinis et al. |
| 11,423,488 | B1* | 8/2022 | Harvey ................ G06V 10/751 |
| 11,574,395 | B2 | 2/2023 | Dev et al. |
| 2005/0254378 | A1 | 11/2005 | Wagner et al. |
| 2006/0192979 | A1 | 8/2006 | Lammert et al. |
| 2008/0137088 | A1 | 6/2008 | Wagner |
| 2009/0271068 | A1 | 10/2009 | Shi et al. |
| 2010/0310130 | A1 | 12/2010 | Beghuin et al. |
| 2012/0300065 | A1 | 11/2012 | Willemann et al. |
| 2013/0057678 | A1 | 3/2013 | Prior Carrillo et al. |
| 2014/0139717 | A1 | 5/2014 | Short |
| 2015/0219500 | A1 | 8/2015 | Maes |
| 2015/0324991 | A1 | 11/2015 | Schmidt et al. |
| 2017/0147990 | A1 | 5/2017 | Franke et al. |
| 2017/0148102 | A1 | 5/2017 | Franke et al. |
| 2017/0352104 | A1 | 12/2017 | Hanson et al. |
| 2019/0170507 | A1 | 6/2019 | Grauzinis et al. |
| 2020/0104940 | A1 | 4/2020 | Krishnan et al. |
| 2021/0041371 | A1 | 2/2021 | Grauzinis et al. |
| 2021/0182713 | A1* | 6/2021 | Kar ..................... G06N 20/20 |
| 2021/0287050 | A1* | 9/2021 | Kar ..................... G06V 10/774 |
| 2022/0005121 | A1* | 1/2022 | Hayward ............... G06N 3/044 |
| 2022/0164942 | A1 | 5/2022 | Dev et al. |

FOREIGN PATENT DOCUMENTS

| | | |
|---|---|---|
| DE | 102016006780 | 12/2017 |
| KR | 102148884 | 8/2020 |
| WO | WO 2015169730 | 11/2015 |
| WO | WO 2018039560 | 3/2018 |

OTHER PUBLICATIONS

Chávez-Aragón et al., "Vision-Based Detection and Labelling of Multiple Vehicle Parts," 2011 14th International IEEE Conference on Intelligent Transportation Systems, Washington, DC, USA. Oct. 5-7, 2011, pp. 1273-1278.

Extended European Search Report in European Appln. No. 19743320.4, dated Nov. 24, 2020, 7 pages.

Extended European Search Report in European Appln. No. 21208984.1, dated Apr. 29, 2022, 12 pages.

GadgEon.com [online], "Deep Learning Model to Classify Hail Damage Claims," Jun. 22, 2020, retrieved on Jul. 29, 2022, retrieved from URL <https://www.gadgeon.com/web/images/story/doc/2731_deep-learning-model-to-classify-hail-damage-claims success story.pdf>, 10 pages.

Huang et al., "Dynamic three-dimensional sensing for specular surface with monoscopic fringe reflectometry", Optics Express, Jun. 20, 2011, 19(13):12809-12814.

Konolige, "Projected Texture Stereo", 2010 IEEE International Conference on Robotics and Automation, May 3-8, 2010, Anchorage, Alaska, USA, 148-155.

Nanonets.com [Online], "Vehicle Damage Assessment," available on or before Jan. 17, 2021, via Internet Archive: Wayback Machine URL<http://web.archive.org/web/20210117112731if_/https://nanonets.com/model/vehicle-damage>, retrieved on Mar. 24, 2021, URL<https://nanonets.com/model/vehicle-damage>, 7 pages.

PCT International Preliminary Report on Patentability in International Appln. No. PCT/US2017/000003, dated Jul. 28, 2020, 6 pages.

PCT International Preliminary Report on Patentability in International Appln. No. PCT/US2017/000043, dated Jan. 29, 2019, 6 pages.

PCT International Search Report and Written Opinion in International Appln. No. PCT/US2017/000003, dated Apr. 19, 2019, 8 pages.

PCT International Search Report and Written Opinion in International Appln. No. PCT/US2017/000043, dated Feb. 1, 2018, 7 pages.

Ren et al., "Absolute height measurement of specular surfaces with modified active fringe reflection deflectometry", Conference Paper in Proceedings of SPIE The International Society for Optical Engineering, Aug. 2014, 9204:920408, 8 pages.

Rocchini et al., "A low cost 3D scanner based on structured light", Computer Graphics Forum, Nov. 2001, 20(3):299-308.

Tian et al., "Deep learning on image denoising: An overview," Neural Networks, 2020, 131:251-275.

Zheng et al., "Structured Light Based 3D Reconstruction Using Gray Code and Line-Shift Stripes," Advanced Materials Research, May 11, 2010, 108-111(1):799-804.

\* cited by examiner

DAMAGE DETECTION USING MACHINE LEARNING

CROSS-REFERENCE TO RELATED APPLICATIONS

This application is a continuation application of and claims priority under 35 U.S.C. § 120 to U.S. application Ser. No. 17/105,184, filed on Nov. 25, 2020, the entire contents of which is incorporated herein by reference.

BACKGROUND

Repairing damage to bodywork is a common task undertaken by repair shops and garages world-wide. In the midwestern US alone approximately 20 000 insurance claims relating to hail damage are filed every year. Repair shops therefore need to assess damage associated with hail storms and other body-work damage in an efficient manner.

Current damage detection techniques rely on a combination of classical computer vision techniques, which often requires bulky and expensive camera rigs. A hybrid 3D optical scanning system can be used for damage detection. An example 3D system may combine methodologies of active stereo 3D reconstruction and deflectometry to provide accurate 3D surface measurements of an object under inspection. Such techniques require a relatively long inspection time and are limited in their ability to detect all damage on a portion of a vehicle, especially at the edges of panels. As the accuracy is not sufficiently reliable manual verification is required, which further increases the time required to complete an inspection.

There is therefore a need for automated damage detection that is faster and more accurate than current methods.

SUMMARY

This specification describes a neural network system implemented as computer programs on one or more computers in one or more locations that is configured process images to generate a damage density estimate.

In a first aspect there is provided a method including, receiving an image of at least a section of a vehicle, processing the received image using damage detection neural network to detect a plurality of hail damage areas on the section of the vehicle and to classify each of the plurality of areas of damage according to the seriousness of the damage, wherein, detecting a plurality of hail damage includes, detecting a plurality of damaged areas distributed over the entire section of the vehicle, and differentiating the plurality of damaged areas from one or more areas of noise, processing the received image using a further neural network to classify one or more sections of the vehicle as one or more panels of the vehicle bodywork, and using the detected areas of damage, the classification of the seriousness of the damage and the classification of one or more panels to compute a panel damage density estimate.

In an implementation, the received image is selected from one of a monocular image or a stereo image.

In an implementation, prior to processing the received image using the further neural network, generating an input to the further neural network from the received image by converting the received image to a binary image.

In an example, processing the converted image using a generator neural network to generate a modified image, wherein the generator neural network has been trained jointly with a discriminator neural network to generate modified images that have reduced image noise relative to input images to the generator neural network.

In an implementation, the plurality of areas of damage are one or more dents in the panels of the vehicle bodywork.

In an example, the seriousness of the damage is classified according to the depth and density of the dents.

In an implementation the first neural network is trained on a data set comprising a mix of image formats, and wherein the further neural network is trained on a data set comprising a mix of image formats.

In an example, the mix of image formats include one or more 3D geometry files.

In an example, the one more 3D geometry files are augmented with simulated hail damage, the simulated hail damage simulated using hail impact analysis.

In an implementation, detecting a plurality of hail damage further comprises differentiating the plurality of damaged areas from one or more sources of noise.

In an example, the one or more sources of noise are selected from dust particles, dirt and specular reflection.

In a second aspect there is provided a system including, one or more cameras,
   one or more computing devices, and one or more storage devices storing instructions that when executed by the one or more computers cause the one or more computers to perform operations comprising, receiving an image of at least a section of a vehicle, processing the received image using damage detection neural network to detect a plurality of hail damage areas on the section of the vehicle and to classify each of the plurality of areas of damage according to the seriousness of the damage, wherein, detecting a plurality of hail damage comprises, detecting a plurality of damaged areas distributed over the entire section of the vehicle, and differentiating the plurality of damaged areas from one or more areas of noise, processing the received image using a further neural network to classify one or more sections of the vehicle as one or more panels of the vehicle bodywork, and
   using the detected areas of damage, the classification of the seriousness of the damage and the classification of one or more panels to compute a panel damage density estimate.

In an implementation, the one or more cameras comprise at least two cameras and the image is a composite stereo 3D image generated from the at least two cameras In an implementation, the one or more cameras comprise a cell-phone camera.

In an implementation, one or more cameras are located at a first location and the one or more computing and one or more storage devices are located at a second location.

In a third aspect there is provided one or more non-transitory computer-readable media storing instructions that when executed by one or more computers cause the one or more computers to perform operations comprising, receiving an image of at least a section of a vehicle, processing the received image using damage detection neural network to detect a plurality of hail damage areas on the section of the vehicle and to classify each of the plurality of areas of damage according to the seriousness of the damage, wherein, detecting a plurality of hail damage comprises, detecting a plurality of damaged areas distributed over the entire section of the vehicle, and differentiating the plurality of damaged areas from one or more areas of noise, processing the received image using a further neural network to classify one or more sections of the vehicle as one or more panels of the vehicle bodywork, and using the detected areas of damage, the classification of the seriousness of the damage and the classification of one or more panels to compute a panel damage density estimate.

In a fourth aspect, there is provided a method comprising, receiving an image of at least a section of a vehicle, generating an input to a neural network from the received image by converting the received image to a binary image, processing the converted image using a generator neural network to generate a modified image, wherein the generator neural network has been trained jointly with a discriminator neural network to generate modified images that have reduced image noise relative to input images to the generator neural network, and processing the converted image using a further neural network to classify one or more sections of the vehicle as one or more panels of the vehicle bodywork.

In an implementation, the received image is a CAD image.

In an implementation, the one more CAD images are augmented with simulated hail damage, the simulated hail damage simulated using hail impact analysis.

In an implementation, the method includes using the processed image as input to a damage detection neural network.

In an implementation, the modified image is used as a training input to one or more of a damaged detection neural network and a neural network to classify one or more sections of the vehicle.

BRIEF DESCRIPTION OF THE DRAWINGS

Like reference numbers and designations in the various drawings indicate like elements.

DETAILED DESCRIPTION

Figure 1:
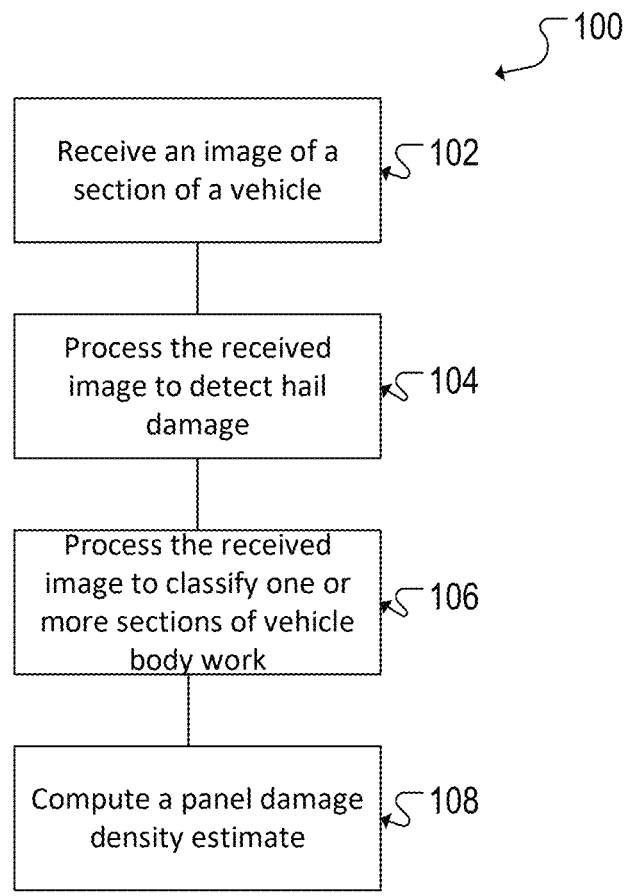
FIG. 1 shows a flow diagram of an example process for damage density determination.

FIG. 1 shows a flow diagram of an example process 100 for damage detection. The process 200 is performed by an appropriately programmed system of one or more computers located in one or more locations, e.g., a system for detecting damage, the system for detecting damage, receives 102 an image of at least a section of a vehicle. The image can be an image of a part or parts of a vehicle, e.g. fender, door, wheel arch etc. The image may be a three-dimensional stereo image, monocular image or other appropriate image.

The system processes 104 the received image to detect a plurality of hail damage areas on the section of the vehicle and to classify each of the plurality of areas of damage according to the seriousness of the damage. Detecting the plurality of hail damage areas can include detecting a plurality of damaged areas distributed over the entire section of the vehicle and differentiating the plurality of damaged areas from one or more areas of noise, the detection may be done using a neural network or other machine learning technique. Sources of noise include dust particles, dirt, specular reflection, flaws in paint etc.

The system further processes 106 the received image using a further neural network to classify one or more sections of the vehicle as one or more panels of the vehicle bodywork.

The system can use the detected areas of damage, the classification of the seriousness of the damage and the classification of one or more panels to compute 108 a panel damage density estimate (see, for example, table 1).

TABLE 1

| Panel type | Dent size classification | | | Total per Panel | Density per panel |
|---|---|---|---|---|---|
| | Small | Medium | Large | | |
| Left Front Door | 200 | 20 | 25 | 245 | 0.314 |
| Left Rail | 5 | 25 | 15 | 45 | 0.058 |
| Left Front Fender | 56 | 7 | 9 | 72 | 0.092 |

In some implementations, the received image may be pre-processed to generate a standard image, for example a binary image. The binary image may also have noise removed. Pre-processing may include converting the image using a generator neural network to generate a modified image, wherein the generator neural network has been trained jointly with a discriminator neural network to generate modified images that have reduced image noise relative to input images to the generator neural network. Pre-processing is described in more detail with respect to FIG. 4 and FIG. 5 below.

In an implementation, the system processes the received image using a neural network, for example, a masked R-CNN. Although a masked RCNN is one example of an appropriate technique for classifying hail damage according the size and seriousness of the damage, the skilled person will be aware that other implementations are possible, for example, other neural network implementations e.g. Fast RCNN, Yolo, or non-neural network based Machine Learning techniques e.g. random forests, gradient boosting etc.

A masked R-CNN is a deep neural network. It consists of a bottom-up pathway, a top-bottom pathway and lateral connections. The bottom-up pathway can be any convolutional neural network which extracts features from raw images e.g. ResNet, VGG etc. The top-bottom pathway (e.g. forward pass) generates a feature map. The forward pass of the CNN results in feature maps at different layers i.e. builds s multi-level representation at different scales. Top-down features are propagated to high resolution feature maps thus having features across all levels The Lateral connections are convolution and adding operations between two corresponding levels of the two pathways.

The masked R-CNN proposes regions of interest in a feature map by using a selective search to generate region proposals for each image using a Region Prediction Network (RPN).

In some examples, the masked R-CNN uses a region of interest pooling layer to extract feature maps from each region of interest and performs classification and bounding box detection on the extracted feature maps. The pooling layer converts each variable size region of interest into a fixed size to be fed to a connected layer by performing segmentation and pooling e.g. max-pooling. Bounding box regression is used to refine the bounding boxes such that class labels and bounding boxes are predicted.

In other examples, the R-CNN uses a region of interest alignment layer. The region of interest alignment layer takes the proposed region of interest and dividing it into a specified number of equal size boxes and applying bilinear interpolation inside each box to compute the exact values of the input features at regularly sampled locations, e.g. 4 regularly sampled locations.

The masked R-CNN can further generate a segmentation mask. An intersection over union (IoU) is computed for each bounding box with a ground truth bounding box. Where the IoU of a bounding box with a ground truth bounding box is greater than a threshold level the bounding box is selected as a region of interest. The masked R-CNN can then further encode a binary mask per class for each region of interest.

Using the above approach a plurality of areas of hail damage can be detected on a received image of at least a section of a vehicle using the masked R-CNN. For example, the plurality of bounding boxes can be used to generate a count of the number of detections of hail damage in the received image and the size of the bounding box may be used to generate an estimate of the seriousness of each area of hail damage. Each area of hail damage can further be labelled as e.g. slight, moderate, severe. Alternatively the damage can be labelled as small, medium, large etc. The binary mask for each region can be used to compute an overall area effected.

In an implementation, the system can use a masked R-CNN to generate a respective classification of one or more sections of the vehicle. The masked R-CNN extracts a feature map from the image and executes a regression such that bounding boxes and class labels are extracted from the feature map and the generates a mask is generated that identifies the damaged section of the vehicle. More generally, however, any appropriate machine learning model can be used to perform the classification.

In an implementation, the system may take the detected panel from the classification of the one or more panel and use the make, model and year of the vehicle to determine the dimensions of the identified panel. The percentage of damage of the identified panel can then be computed and a proportion of the damage that is slight, moderate and severe can be identified. Using the damage density estimate a user of the system can therefore determine whether it is cost effective to repair the panel or whether the panel should be replaced.

In an implementation a first neural network (arranged to detect a plurality of areas of hail damage) and a further neural network (arranged to identify one or more panels in an image of a section of a vehicle) are trained on a data set including a mix of image formats. The images can be annotated with training labels, for example, the training labels can be provided in COCO format. COCO is large scale images with Common Objects in Context (COCO) for object detection, segmentation, and captioning data set. The mix of image formats may include one or more 3-D geometry files e.g. CAD files. The 3-D geometry files may be augmented with hail damage simulated using impact analysis. Impact analysis make be executed using an appropriate simulation method e.g. finite element analysis. Examples of commercially available products for finite element analysis include Ansys (Ansys, Inc.) and Abaqus (Dassault Systemes).

The hail damage may be simulated under different lighting conditions, lighting conditions can be simulated using appropriate lighting techniques, e.g. ray-tracing, ray-casting etc.

Figure 2:
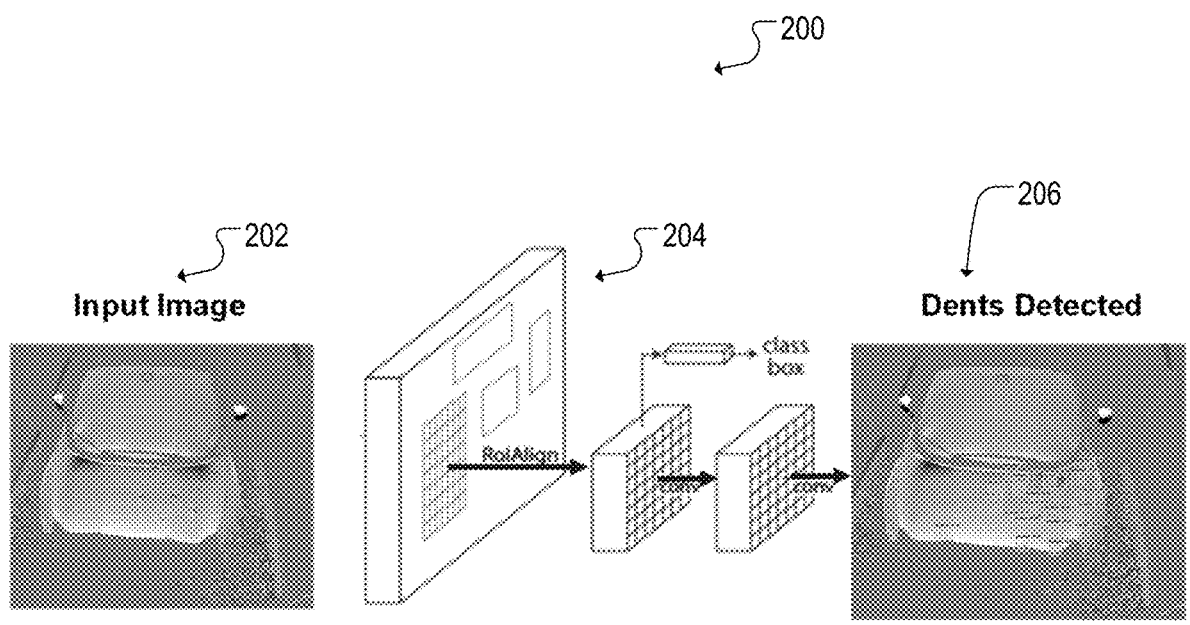
FIG. 2 is a schematic diagram of an example of dent detection

FIG. 2 is a schematic diagram 200 of an example of dent detection.

An input image 202 is received. In some implementations the input image 202 may have undergone various pre-processing steps prior to being input into the dent detection system. For example, the image may be pre-processed to remove background features, remove noise, convert the image to greyscale etc. The received image can be converted to a binary image prior to undergoing processing. The received image may be selected from a stereo image or a monocular image. In some implementations the image may be an image from one or more high resolution cameras. In other implementations the image may be an image from one or more consumer grade cameras e.g. a cell-phone camera, D-SLR or other appropriate camera.

The image undergoes processing at a machine learning system 204, e.g. a system that performs the method of processing images described with reference to FIG. 1. The system having been previously trained using a training data set that is labelled and/or masked to train the system to detect a plurality of regions of hail damage. In an implementation the image can be converted into a feature map and undergo one or more convolutions and/or regressions to output one or more classifications and one or more bounding boxes and/or masks associated with one or more detected areas of hail damage in the input image. An output image 206 may be generated which indicates the one or more identified areas of hail damage on the received input image.

Figure 3:
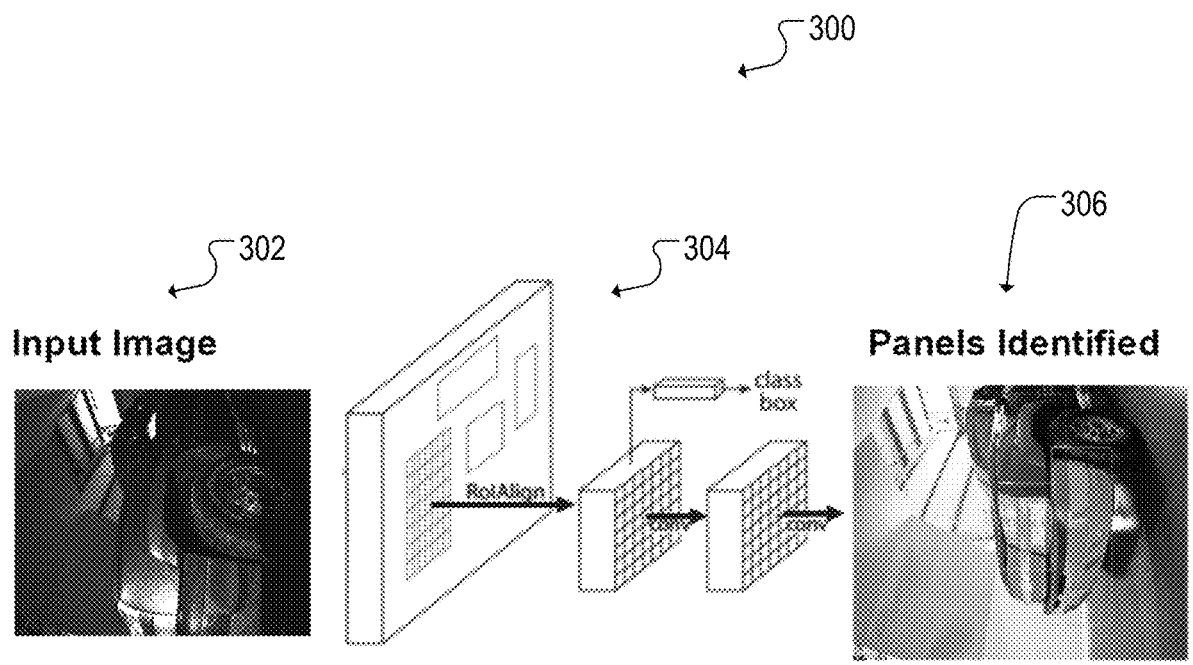
FIG. 3 is a schematic diagram of an example of panel detection.

FIG. 3 is a schematic diagram 300 of panel detection.

An input image 302 is received. In some implementations the input image 302 may have undergone various pre-processing steps prior to being input into the dent detection system. For example, the image can be pre-processed to remove background features, remove noise, convert the image to greyscale etc. The received image can be converted to a binary image prior to undergoing processing. The received image can be selected from a stereo image or a monocular image. In some implementations the image may be an image from one or more high resolution cameras. In other implementations the image may be an image from one or more consumer grade cameras e.g. a cell-phone camera, D-SLR or other appropriate camera.

The image under goes processing at a machine learning system 304, e.g. a system that performs the method of processing images described with reference to FIG. 1. The system having been previously trained using a training data set that is labelled and/or masked to train the system to detect panels of a vehicle. In an implementation the image can be converted into a feature map and undergo one or more convolutions and/or regressions to output one or more classifications and one or more bounding boxes and/or masks associated with panel classifications in the image. An output image 306 can be generated which indicates e.g. using a mask generated by the neural network one or more identified panels in the image.

Figure 4:
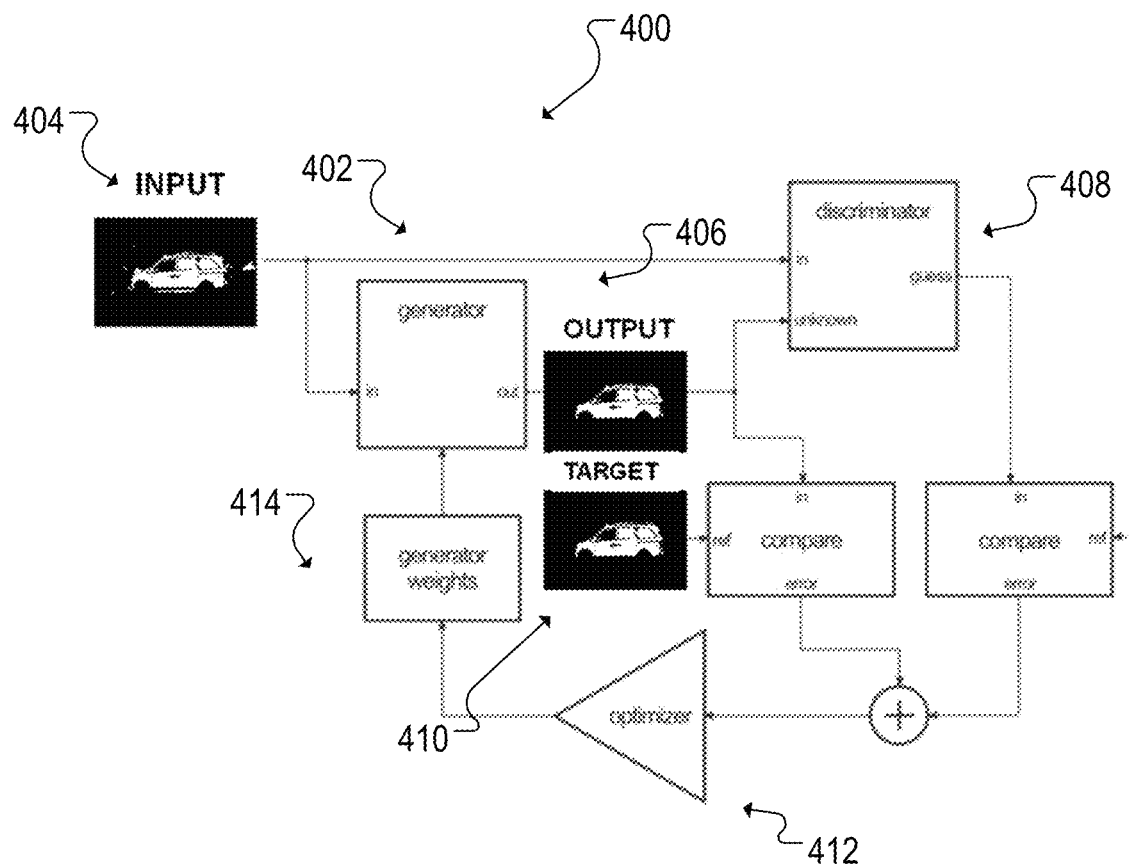
FIG. 4 is a schematic diagram of an example system for reducing noise in images for damage detection.

FIG. 4 is a schematic diagram of an example system 400 for reducing noise in images for damage detection.

The system may use a Generative Adversarial Network (GAN). In a GAN, two neural networks are used in competition. The generator network 402 receives an input image 404 and generates a new output image 406 from the input image using learned parameters. The output image 406 is passed to a discriminator network 408 to predict whether the output image 406 has been generated by the generator network 404 or is a real image.

During training, the two networks are trained on an objective function that causes the two networks to "compete" with each other, the generator network to fool the discriminator network and the discriminator network to correctly predict which images are real. The generator network is therefore trained to effectively perform a specific task, e.g. remove noise from an image. In an initial training phase the training data set may be, for example a set of images to which noise has been artificially added. The training data set may include noise and/or artifacts that are associated with dents and/or panels and may also include noise and/or artifacts that are not associated with any panels.

The generator network 402 can be trained to remove the noise from the image. The discriminator network 408 can predict whether the image is an image output by the generator network 402 or whether it is a target image 410 from the ground truth data set, i.e., an image from the data set that includes the images prior to the noise being artificially added. A first comparison can be made between the target image 410 and the output image 406 and a second comparison can be made between the target image 410 and the prediction of the discriminator network 408. The comparisons can be passed to an optimizer 412 which updates the weights 414 of the generator network and the discriminator neural network to optimize a GAN objective.

In a first implementation the GAN objective may comprise finding an equilibrium between the two networks {Generator (G) and Discriminator (D)} by solving a minimax equation as indicated below:

$$\min_{\theta} \max_{\phi} V(G_\theta, D_\phi) = \mathbb{E}_{x \sim p_{data}}[\log D_\phi(x)] + \mathbb{E}_{z \sim p(z)}[\log(1 - D_\phi(G_\theta(z)))]$$

This equation is known as minimax equation (derived from KL-divergence criterion) as it is trying to jointly optimize two parameterized networks, G (Generator) and D (Discriminator), to find an equilibrium between the two. The objective is to maximize the confusion of D while minimizing the failures of G. When solved, the parameterized, implicit, generative data distribution should match the underlying original data distribution fairly well.

In a further implementation the goal of the generative model is to come up with a procedure of matching its generated distribution to a real data distribution so it can fake the discriminator network. Minimizing the distance between the two distributions is critical for optimizing the generator network so it could generate images that are identical to a sample from the original data distribution (p(x)). In order to measure the difference between the generated data distribution (q(x)) and the actual data distribution (p(x)), there are multiple objective functions. For example, Jensen Shannon Divergence (JSD) {derived from Kullbach-Liebler Divergence (KLD)}, Earth-Mover (EM) distance (AKA Wasserstein distance) and Relaxed Wasserstein GAN to name a few.

The trained generator network 402 can then be used to generate de-noised input images for input into one or more or of a panel detection neural network and a dent detection neural network. The images can be, for example, a set comprising a mix of image formats, and wherein the further neural network is trained on a data set comprising a mix of image formats. The output image are de-noised binary images.

Figure 5:
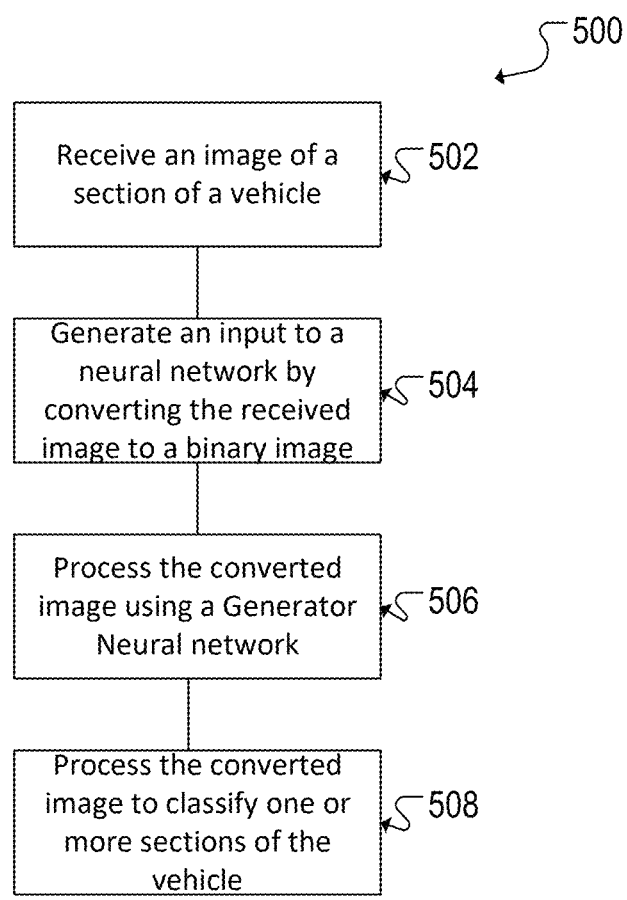
FIG. 5 is a flow diagram of an example method for generating images in a standard format for hail damage analysis.

FIG. 5 is a flow diagram of an example method 500 for generating images in a standard format for hail damage analysis. The method 500 may be executing using, for example, a GAN network, as described with reference to FIG. 5 above. The method may be used to generate images in a standard format for training a damage detection neural network and/or a panel detection neural network as described above. Alternatively it may be used to increase the quality of images fed to a network during a prediction phase. For example, reducing the amount of noise and/or sources of confusion in the image e.g. noise dust particles, dirt and specular reflection, An input image is received 502, the input image comprising an image of at least a section of a vehicle. The input image may include a plurality of damaged areas distributed over the entire section of the vehicle, the image may also include one or more areas of noise. In an implementation the input image may be a 3D geometry file, for example a CAD file that includes one or more simulated areas of damage.

An input to a neural network may be generated by converting the received image to a binary image 504, The converted image can be processed 506 using a generator neural network to generate a modified image, wherein the generator neural network has been trained jointly with a discriminator neural network to generate modified images that have reduced image noise relative to input images to the generator neural network.

The output images may be used as input to a machine learning system to detect hail damage. The machine learning system to detect hail damage processing the converted image using a further neural network to classify one or more sections of the vehicle as one or more panels of the vehicle bodywork. The machine learning system can further detect a plurality of damaged areas distributed over the entire section of the vehicle and differentiate the plurality of damaged areas from one or more areas of noise.

Figure 6:
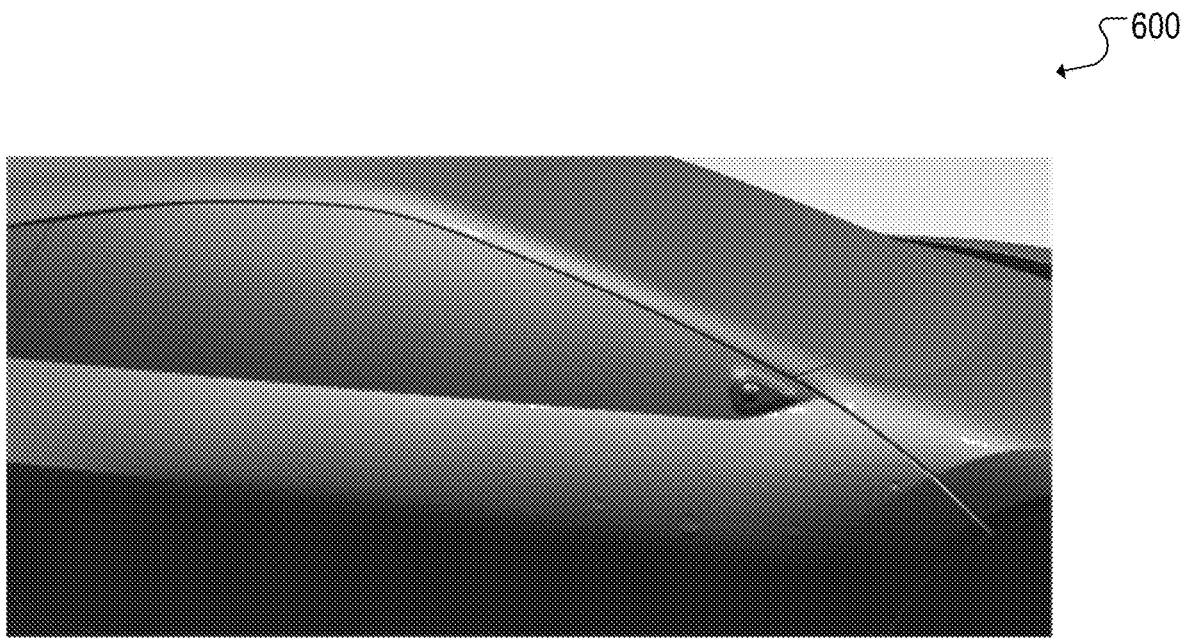
FIG. 6 is an example image used to train a damage detection neural network.

FIG. 6 is an example of a 3D geometry file (e.g. a CAD file) 600 with generated hail dents as used to train one or more of the machine learning systems described above.

Figure 7:
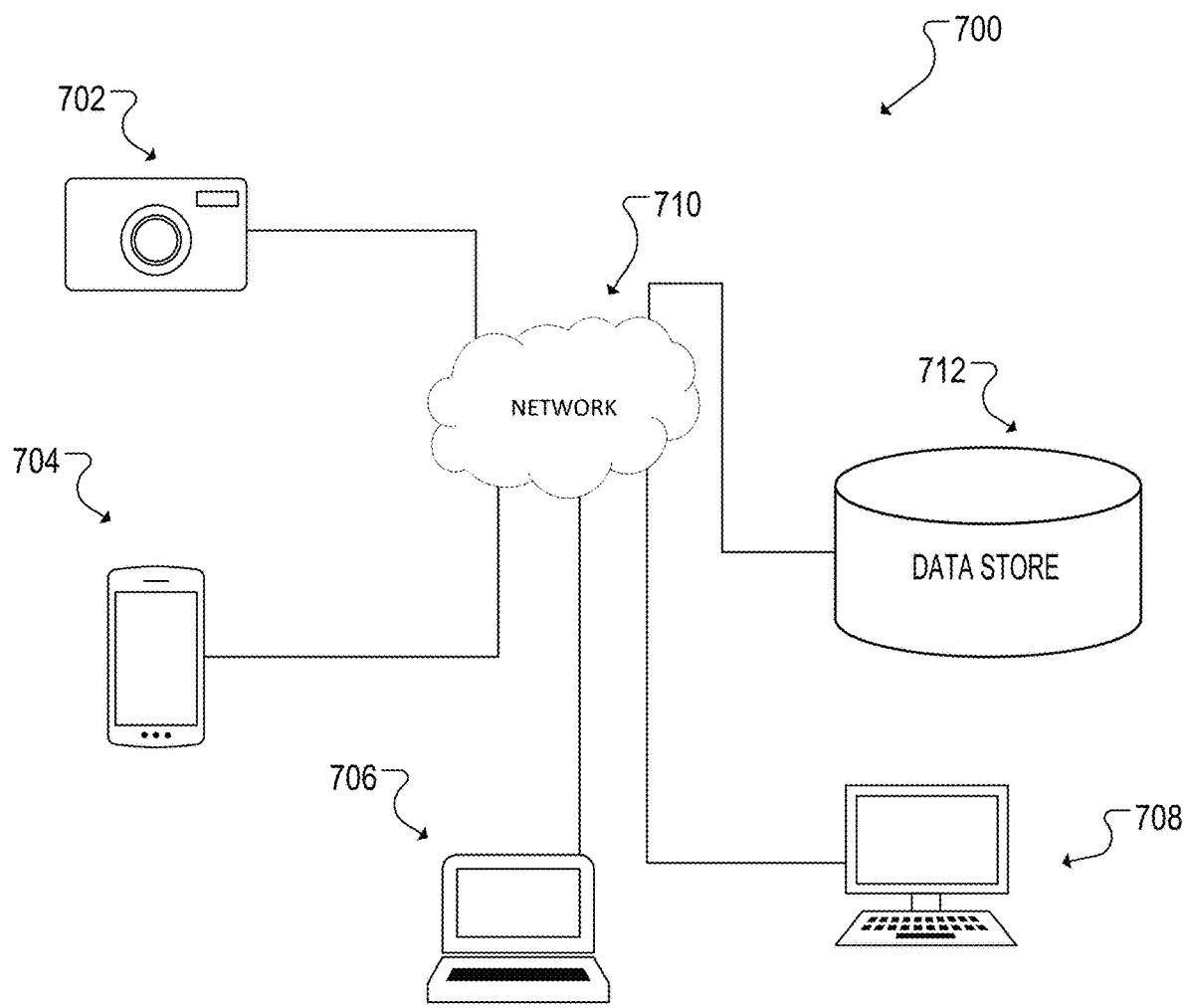
FIG. 7 is a schematic diagram of an example system for image processing.

FIG. 7 is a schematic diagram of an example system 700 for image processing.

The system may include one or more cameras, e.g. camera 702 and smartphone camera 704. As noted above the cameras may be one or more specialist or high resolution cameras e.g. active or passive stereo vision cameras, Gigapixel monocular or single vision cameras etc. In other implementations the one or more consumer grade cameras e.g. smartphone camera 704, DSLR camera etc. In some implementations a combination of specialist and consumer grade cameras may be used.

The one or more cameras can be connected to one or more computing devices, e.g. laptop 704 or terminal 708 via a network 710. The network 710 can be a wired or wireless network. The cameras may be enabled to transfer images via a wireless network, e.g. cellular network, wireless, Bluetooth, NFC or other standard wireless network protocol. The cameras may alternatively or additionally be enabled to transfer the images via a wired network, e.g. via a computer network cable (e.g. CAT 5, 6 etc.), USB cable. Alternatively or additionally the images can be transferred via other physical media; flash drive, memory card, CD, DVD etc.

The system may further include one or more storage devices, e.g. storage device 712 which is arranged to store instructions. Storage device 712 may be a separate storage device, e.g. external storage, cloud storage etc. or may be storage that is internal to the computing device.

When the instructions stored at storage device 712 are executed by one or more computers 704, 708 the instructions cause the one or more computing devices to perform operations including; receive an image of at least a section of a vehicle, process the received image using damage detection neural network to detect a plurality of hail damage areas on the section of the vehicle and to classify each of the plurality of areas of damage according to the seriousness of the damage, process the received image using a further neural network to classify one or more sections of the vehicle as one or more panels of the vehicle bodywork; and compute a panel damage density estimate, as described in more detail above with reference to FIG. 1. The system set out in FIG. 7 may further be implemented to execute any of the foregoing methods.

The one or more computing devices may be arranged to execute the instructions in serial, i.e. on a single processor at a single at a single computing device, or in parallel, i.e. on a plurality of processors located on one or more computing devices.

Other embodiments and modifications of the present invention will be readily apparent to those of ordinary skill in the art having the benefit of the teachings presented in the foregoing description and drawings.

The invention claimed is:

1. A computer-implemented method, comprising:
obtaining an image of at least one section of a vehicle;
processing the image using a first machine learning algorithm to detect a plurality of damage areas on the at least one section of the vehicle;
processing the image using a second machine learning algorithm to classify the at least one section of the vehicle as one or more panels of the vehicle; and
generating a damage assessment report based on the plurality of damage areas and the one or more panels of the vehicle.

2. The computer-implemented method of claim 1, wherein detecting the plurality of damage areas on the at least one section of the vehicle comprises:
classifying each of the plurality of damage areas into a corresponding one of predetermined category types based on at least one of a size of the damage area or a seriousness of the damage area.

3. The computer-implemented method of claim 2, wherein detecting the plurality of damage areas on the at least one section of the vehicle comprises:
for each of the plurality of damage areas, enclosing the damage area with a respective bounding box, and determining a corresponding category type based on a size of the respective bounding box.

4. The computer-implemented method of claim 2, wherein the predetermined category types comprise one of
small, medium, and large, or
slight, moderate, and severe.

5. The computer-implemented method of claim 2, wherein generating the damage assessment report comprises:
for each of the one or more panels of the vehicle, counting a respective number of damage areas that are associated with the panel and have a same corresponding category type of the predetermined category types.

6. The computer-implemented method of claim 1, wherein each of the first machine learning algorithm and the second machine learning algorithm is trained on a data set including a mix of image formats, and wherein the mix of image formats comprises Common Objects in Context (COCO) format, and the data set comprises one or more 3D geometry files.

7. The computer-implemented method of claim 6, wherein at least one of the one or more 3D geometry files is an image augmented with simulated hail damage that are simulated using hail impact analysis.

8. The computer-implemented method of claim 1, wherein generating the damage assessment report comprises:
for each of the one or more panels of the vehicle, generating at least one of a total count of damage areas associated with the panel or a panel damage density of the panel based on the total count of damage areas and an area of the panel.

9. The computer-implemented method of claim 1, wherein the first machine learning algorithm comprises at least one of:
masked Region-based Convolutional Neural Network (R-CNN), Fast R-CNN, Yolo, random forests, or gradient boosting.

10. The computer-implemented method of claim 1, wherein the second machine learning algorithm comprises masked R-CNN.

11. The computer-implemented method of claim 1, wherein detecting the plurality of damage areas on the at least one section of the vehicle comprises:
differentiating the plurality of damage areas from one or more areas of noise, wherein one or more sources of the one or more areas of noise comprise at least one of dust particles, dirt, specular reflection, or flaws in paint.

12. The computer-implemented method of claim 1, wherein the image comprises a monocular image or a stereo image.

13. The computer-implemented method of claim 1, wherein, prior to processing the image, the computer-implemented method further comprises:
converting the image to a binary image; and
processing the binary image using a generator neural network to generate a modified image,
wherein the generator neural network has been trained jointly with a discriminator neural network to generate modified images that have reduced image noise relative to input images to the generator neural network.

14. A system comprising:
one or more cameras;
one or more processors; and
one or more memories storing instructions executable by the one or more processors to perform operations comprising:
obtaining an image of at least one section of a vehicle;
processing the image using a first machine learning algorithm to detect a plurality of damage areas on the at least one section of the vehicle;
processing the image using a second machine learning algorithm to classify the at least one section of the vehicle as one or more panels of the vehicle; and
generating a damage assessment report based on the plurality of damage areas and the one or more panels of the vehicle.

15. The system of claim 14, wherein the one or more cameras comprise at least two cameras, and the image is a composite stereo 3D image generated from the at least two cameras.

16. The system of claim 14, wherein the one or more cameras comprise a cell-phone camera or a digital single-lens reflex (D-SLR) camera.

17. A computer-implemented method, comprising:
  receiving an image of at least one section of a vehicle;
  converting the received image to a binary image;
  processing the binary image using a generator neural network to generate a modified image, wherein the generator neural network has been trained jointly with a discriminator neural network to generate modified images that have reduced image noise relative to input images to the generator neural network; and
  outputting the modified image to a damage detection neural network to perform damage detection on the at least one section of the vehicle based on the modified image.

18. The computer-implemented method of claim 17, further comprising:
  outputting the modified image or the binary image to a panel detection neural network for classifying the at least one section of the vehicle as one or more panels of the vehicle.

19. The computer-implemented method of claim 17, wherein the received image is a CAD image augmented with simulated hail damage that is simulated using hail impact analysis.

20. The computer-implemented method of claim 17, wherein processing the binary image using the generator neural network to generate the modified image comprises:
  receiving the binary image as an input image of the generator neural network and generating an output image from the input image; and
  passing the output image to the discriminator neural network to predict whether the output image has been generated by the generator neural network or is a real image.

\* \* \* \* \*